United States Patent
Mane et al.

(10) Patent No.: US 11,946,139 B2
(45) Date of Patent: Apr. 2, 2024

(54) ATOMIC LAYER DEPOSITION OF LITHIUM BORON COMPRISING NANOCOMPOSITE SOLID ELECTROLYTES

(71) Applicant: UCHICAGO ARGONNE, LLC, Chicago, IL (US)

(72) Inventors: Anil U. Mane, Naperville, IL (US); Devika Choudhury, Naperville, IL (US); Jeffrey W. Elam, Elmhurst, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 115 days.

(21) Appl. No.: 17/039,822

(22) Filed: Sep. 30, 2020

(65) Prior Publication Data

US 2022/0098736 A1 Mar. 31, 2022

(51) Int. Cl.
*C23C 16/455* (2006.01)
*C23C 16/38* (2006.01)
*C23C 16/44* (2006.01)
*H01M 10/0562* (2010.01)

(52) U.S. Cl.
CPC ........ *C23C 16/45555* (2013.01); *C23C 16/38* (2013.01); *C23C 16/4408* (2013.01); *C23C 16/45534* (2013.01); *C23C 16/45553* (2013.01); *H01M 10/0562* (2013.01); *H01M 2300/0068* (2013.01)

(58) Field of Classification Search
CPC .............. C23C 16/45555; C23C 16/38; C23C 16/4408; C23C 16/45534; C23C 16/45553; H01M 10/0562; H01M 2300/0068
See application file for complete search history.

(56) References Cited

U.S. PATENT DOCUMENTS

| | | | |
|---|---|---|---|
| 2,422,884 | A | 6/1947 | Burgin |
| 4,392,002 | A | 7/1983 | Cosyns et al. |
| 4,544,791 | A | 10/1985 | Juguin et al. |
| 6,110,854 | A | 8/2000 | Aldinger et al. |
| 6,174,432 | B1 | 1/2001 | Mizutani et al. |
| 6,749,828 | B1 | 6/2004 | Fukunaga |
| 6,835,349 | B2 | 12/2004 | Pyzik et al. |
| 2001/0041250 | A1 | 11/2001 | Werkhoven et al. |
| 2002/0037937 | A1 | 3/2002 | Raje et al. |
| 2003/0207032 | A1 | 11/2003 | Ahn et al. |
| 2010/0108981 | A1* | 5/2010 | Jayasekara .......... H01L 51/0591 257/E47.001 |
| 2014/0001090 | A1 | 1/2014 | Yang et al. |

(Continued)

FOREIGN PATENT DOCUMENTS

EP 0 960 652 A1 12/1999

OTHER PUBLICATIONS

Blackburn, et al., "Thermodynamics of Vaporization in the Aluminum Oxide-Boron Oxide System," Journal of Physical Chemistry 70(8), pp. 2469-2474 (1966).

(Continued)

*Primary Examiner* — Michael G Miller
(74) *Attorney, Agent, or Firm* — Foley & Lardner LLP (57) ABSTRACT

A lithium boron coating and a method of producing the same. Atomic layer deposition deposits lithium and boron to form a lithium borate layer. The lithium borate maybe deposited as a solid electrolyte.

14 Claims, 6 Drawing Sheets

(56) References Cited

U.S. PATENT DOCUMENTS

| | | | |
|---|---|---|---|
| 2014/0302392 A1* | 10/2014 | Li | H01M 4/525 |
| | | | 429/223 |
| 2019/0062915 A1* | 2/2019 | Mane | C23C 16/403 |
| 2020/0028208 A1* | 1/2020 | Dasgupta | H01M 10/0585 |

OTHER PUBLICATIONS

Dou, et al., "Effect of lithium boron oxide glass coating on the electrochemical performance of $LiNi1/3Co1/3Mn1/3O2$," Journal of Solid State Electrochemistry 16, pp. 1481-1486 (2012).

Du, et al., "Surface modification of a $LiNi0.5Mn1.5O4$ cathode with lithium boron oxide glass for lithium-ion batteries," RSC Advances 5(71), pp. 57293-57299 (2015).

Dubois & Fujieda, "Preparation of boron-containing and alumina supports by kneading," Studies in Surface Science and Catalysis 91, pp. 833-842 (1995).

Elam & George, "Growth of $ZnO/Al2O3$ Alloy Films Using Atomic Layer Deposition Techniques," Chemistry of Materials 15(4), pp. 1020-1028 (2003).

Ito, et al., "Ionic conductivity of $Li2O$—$B2O3$ thin films," Journal of Non-Crystalline Solids 57(3), pp. 389-400 (1983).

Karpova, et al., "Synthesis, Structure and Properties of the System $B2O3/Al2O3$," Chemistry for Sustainable Development 21, pp. 53-60 (2013).

Kazyak, et al., "Atomic layer deposition and first principles modeling of glassy $Li3BO3$—$Li2CO3$ electrolytes for solid-state Li metal batteries," Journal of Materials Chemistry A 6(40), pp. 19425-19437 (2018).

Kazyak, et al., "Atomic Layer Deposition of Ultrathin Lithium Borate Solid Electrolytes," ECS Meeting Abstracts, MA2018-02 997 (2018).

Liao, et al., "Synthesis and Characterization of Lithium Bis(fluoromalonato)borate for Lithium-Ion Battery Applications," Advanced Energy Materials 4(6), 1301368, 12 pages (2014).

Libera, et al., "Conformal ZnO coatings on high surface area silica gel using atomic layer deposition," Thin Solid Films 516(18), pp. 6158-6166 (2008).

Mane, et al., "Atomic layer deposition of boron-containing films using $B2F4$," Journal of Vacuum Science & Technology A 34, 01A132, 5 pages (2016).

Shonhiwa, et al., "Reaction bonded aluminum oxide composites containing cubic boron nitride," Ceramics International 35(2), pp. 909-911 (2009).

Yun, et al., "Improved electrochemical performance of boron-doped carbon-coated lithium titanate as an anode material for sodium-ion batteries," Journal of Materials Chemistry A 5(6), pp. 2802-2810 (2017).

* cited by examiner

| Element | Atomic% | |
|---|---|---|
| | Surface | After Etching |
| Li | 21 | 15.7 |
| B | 28.3 | 33.6 |
| O | 47 | 49.4 |
| C* | 3.7 | 1.3 |

*Not considering adventitious carbon at 284.4eV; note lithium diborate $LiB_2O_{3.5}$, usually formulated $Li_2B_4O_7$

ATOMIC LAYER DEPOSITION OF LITHIUM BORON COMPRISING NANOCOMPOSITE SOLID ELECTROLYTES

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates to atomic layer deposition, specifically formation of a lithium boron composite layer.

BACKGROUND

Solid-state batteries are increasingly a focus of interest because of their properties. Solid-state batteries provide a range of properties, such as higher operating potential, higher energy density, longer cycle life, and improved safety, that make them an attractive option when compared to conventional liquid electrolyte-based Li-ion batteries. However, solid-state batteries present a host of challenges to reach their full potential.

Manufacturing solid-state batteries is reliant on one of several less than desirable process. Techniques for forming the solid state electrolyte materials currently limit the physical structure and geometries that can be used in constructing a solid-state battery, something viewed as a limiting factor in adapting and evolving solid-state batteries for a wide range of uses. Traditional physical vapor deposition processes are unable to form uniform, pinhole-free films on complex non-planar geometries over large area. Coating of thin solid electrolytes on complex 3-D structures is considered key to enabling a wide range of thin film and bulk battery solid-state battery designs that offer high energy and power density improvements compared to planar structures.

Some work has been done with regard to atomic layer deposition ("ALD") as a process for production of solid-state electrolytes ("SSE"). However, published work on ALD SSE indicates that the research community has not been able to produce cost effective thin film coatings with ionic conductivities comparable to that of sputtered lithium phosphorus oxynitride ("LiPON") ($\sim 2*10^{"}6$ Siem at 300K), which is the current state-of-the art SSE in thin-film batteries.

There are several reports that have demonstrated the potential of ALD films for both interfacial engineering of bulk solid state batteries and for thin film batteries fabrication. Coatings with improved ionic conductivity would enable faster charging rates, more robust electrolyte films, safer battery and serve as a better platform for solid-state battery development with complex geometrical structures. However, while thin layer deposition is a goal, the desired outcomes have not been achieved. There remains a need for a process of making SSE via ALD that can achieve the conductivity, stability, conformity, and economics desired.

SUMMARY

At least one embodiment relates to a method of forming a lithium boron coating comprising providing a substrate within an atomic layer deposition reactor and depositing a coating of lithium boron composite by an atomic layer deposition process. The ALD process includes pulsing a lithium precursor comprising a lithium tertiary butoxide into the reactor, purging the reactor of the lithium precursor, pulsing a boron precursor and co-reactant precursor, and purging the reactor of the boron precursor and co-reactant precursor.

Another embodiment relates to a method of forming a boron lithium coating comprising providing a substrate within an atomic layer deposition reactor and depositing a coating of lithium boron composite by an atomic layer deposition process. The ALD process includes pulsing a lithium precursor comprising a lithium tertiary butoxide into the reactor, purging the reactor of the lithium precursor, pulsing a boron precursor and co-reactant precursor, and purging the reactor of the boron precursor and co-reactant precursor.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

FIGS. 2A-2B illustrate in-situ Fourier-transform infrared spectroscopy ("FTIR") results for lithium tertiary butoxide ("LiOTBu") and boric acid and methanol solution ("BAMeOH").

FIG. 4E illustrates the content (as atomic %) on the surface of the film and after Ar etching to remove the adventitious carbon on the surface. In typical XPS measurements, it is well know that the most of the nanomaterial (thin film) are contaminated with some atmospheric $CO_2$ or OH. To account for this, the surface is cleaned with sputter ions (Ar) which etch the surface with desire etch rate base on ion gun energy (1000 eV) and duration (30 s). After removal of contamination layer one can get reasonable clean surface composition. This composition is given in right column name as after etching.

DETAILED DESCRIPTION

In one embodiment, ALD is utilized. In its simplest form, ALD is a four-step process consisting of two, two-step half-cycles. In a first half-cycle, in a first step, a first precursor binds to the surface of the substrate (adsorption), and the excess first precursor, along with the byproducts formed, are then purged in the next step. In a second half-cycle, a second precursor (or co-reactant) is added to react with the adsorbed/bound intermediate entity formed by the first precursor. The excess second precursor and byproducts are then purged out, completing the full ALD cycle. The reaction of the second precursor with the first adsorbed entity forms a deposited material.

Figure 1:
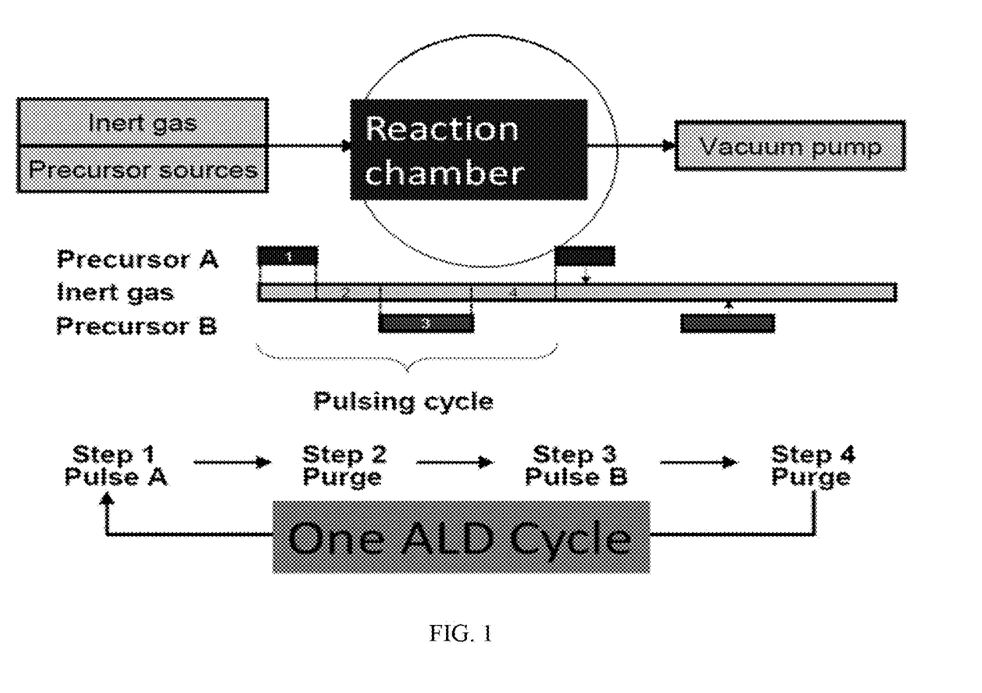
FIG. 1 shows one embodiment of a typical ALD process, including the nature of ALD cycle and steps involved in ALD cycle process.

In one embodiment, the general ALD process includes a substrate that is reacted with a first precursor in the first half reaction to form a first intermediate entity having the a metal from the first precursor. In a second half reaction, a second precursor, such as a reducing agent, is exposed to the first intermediate entity and reacted to form a lithium film, such as a lithium borate. FIG. 1 illustrates one embodiment of such a process. Some embodiments relate to the formation of a lithium borate materials. Some embodiments relate to a process for forming a lithium borate material by ALD deposition through supercycle of a first reaction between a lithium precursor and an oxidant and second reaction between a boron precursor and an oxidant, where the first and second reaction may be in equal cycles or unequal cycles.

The ALD occurs with a substrate serving as the initial deposition surface. The substrate may be cathodes or anodes, such as high surface area aerogels, membranes, filters, separators, etc. The ALD process includes a lithium deposition reaction using a lithium precursor. In one embodiment, the lithium precursor comprises lithium tertiary butoxide. The first lithium precursor reacts to form a lithium intermediate, such as lithium silylamide (LiHMDS), (N,N-Di-i-propylacetamidinato)lithium, Li(thd).

In one embodiment, the ALD process includes a first reactant. The first reactant may be, for example, $H_2O$, $O_3$, $H_2O_2$, $N_2O$, and reactive with the lithium intermediate.

The ALD process further includes a boron deposition reaction using a boron precursor. The boron precursor is reactive with the substrate and or the lithium material formed by the first metal precursor to form a lithium borate compound. The boron precursor may be selected from the group consisting of boric acid, trimethyl borate, triethyl borate, triethyl borate, $B_2H_6$, $B_2F_4$, $BF_3$ and $Hf(BH_4)_4$, but these are hazardous materials toxic and corrosive precursors. A co-reactant is used with the boron precursor. The co-reactant may be selected from the group of organic solvents consisting of methanol, acetone, IPA, ethanol, and acetic acid ca be use as oxide. The boron precursor and co-reactant may be treated as a singular ALD exposure; for example, the boron precursor may be dissolved in the co-reactant and pulsed as a solution into the reaction chamber. The boron precursor may comprise a solution of boric acid and alcohol, providing trimethy borate or triethyl borate.

In one embodiment, each ALD process consists of a cycle, which may be repeated to form desired thickness of film. A cycle consists of a precursor vapor pulse for an exposure followed by a purge, such as where the reactor is pumped to a vacuum, followed by an oxidant pulse with a oxidant exposure followed by a oxidant purge. It should be appreciated that the dose and purge time is based on the self-limiting behavior of the precursors/oxidant. This can be varied in a wide range from a few milliseconds to tens of seconds. Further if a longer dose than purge time is utilized, the times may need to increase to avoid a chemical vapor deposition ("CVD") type reaction, which can result in non-uniformity and particles formation.

It should be appreciated that more complicated ALD schemes can be constructed as a super-cycle comprising various sub-cycles for depositing a material as described or for depositing multiple different materials as layers between the lithium boron film or as a dopant. The respective pulse and exposures may be the same time or pulse may be for a shorter time than the overall exposure.

In an alternative embodiment, the deposition is of boron doped lithium fluoride. In these embodiments, the boron precursor may be one reactive with the co-reactant to deposit a boron fluoride material. For example, the boron precursor may be Boron fluoride and the co-reactant may be HF or HF-pyridine. In a further embodiment, the ALD process includes a second boron precursor, such as boron fluoride, and a second co-reactant, such as HF or HF-pyridine, allowing for deposition of boron fluoride as a dopant in the boron lithium composite material. Further, additional deposition or co-reactants, such as $WF_6$, HF, Hfac, $TMA-ALF_3$ ($AlF_3$), can used to stabilized the LiBOF composite. In a further embodiment, ALD process using TMA-Boric acid+methanol results in BAlO, which can stabilize this LiBOF composite.

In an alternative embodiment, the deposition is of lithium borate with sulfide, which may be a boron-doped lithium sulfate. In these embodiments, the ALD precursor may be a sulfide compound, for example. In an alternative embodiment, the deposition is of a boron-doped lithium sulfide. In these embodiments, the boron precursor may be one reactive with the co-reactant to deposit a boron sulfide material. For example, the boron precursor may be boron sulfide and the co-reactant may be S or $H_2S$. In a further embodiment, the ALD process includes a second boron precursor, such as boron sulfide, and a second co-reactant, such as S or $H_2S$, allowing for deposition of boron sulfide as a dopant in the boron lithium composite material.

In some embodiments, the substrate can be heated to a predetermined temperature during the ALD process. For example, the first predetermined temperature can be in the range of 50-200° C. (e.g., 50, 60, 70, 80, 90, 100, 110, 120, 130, 140, 150, 160, 170, 180, 190 or 200° C., inclusive of all ranges and values therebetween). In some embodiments, the first predetermined temperature is in the range of 100-300° C. (e.g., 225° C.). Temperature also impacts the overall energy in the system and the performance for diffusion and/or reaction. In an ALD process, the deposition temperature range where more or less same growth as function of growth occurs is referred to as the "ALD window." The ALD reaction should occur at a temperature of the precursor which sufficient to give constant precursor's evaporation rate (i.e., vapor pressure). If vapor pressure is not enough, there may still be layer growth, but the surface coverage will be poor. If vapor pressure is too much, it will waste precursor, and there may be CVD growth if there is not sufficient purge time due to mixing of precursors. The temperature of the layer growth can be as low as subliming temperature of the ALD precursors. For example if precursor sublimes at 150° C. films can also grow around that temperature. But generally layer growth temperature is 25-50° C. higher than precursor sublimation temperature, such as 50-250° C. for precursors described for some embodiments. Further, in some embodiments, plasma can be used to enhance growth rate/tailor the composition of the deposited layer.

In some embodiments, the lithium precursor is a vapor and the lithium precursor pulse comprises input to the reactor of a lithium precursor vapor for a lithium precursor pulse time of a few milliseconds to 10 s of seconds (e.g., 0.5, 1, 5, 10, 20, or 30 seconds, inclusive of all ranges and values therebetween). The first partial pressure of the lithium precursor pulse can be in the range of 0.01-1000 Torr (e.g., 10, 25, 50, 75, 100, 500, or 1000 Torr, inclusive of all ranges and values therebetween), such as, in one embodiment, at least 0.5-100 Torr. One of skill in the art will appreciate that the time length, pressure, and amount of precursor for the pulse are all factors in determining the overall amount for each of those operation parameters. For example, the pressure and amount may follow from the duration of the pulse but depend on the size of the chamber and the type of valve as would be understood from general knowledge regarding ALD. Note, for ease of reference herein, the process is described with regard to the pulse duration, but it should be understood that the precursor partial pressure is what dictates the diffusion boundary conditions. A carrier gas, such as argon or other non-reactive (with the substrate or the precursors) gas, may be used.

In some embodiments, the lithium precursor exposure comprises exposing the substrate to the lithium precursor for a first exposure time and a first partial pressure of the lithium precursor so that the lithium precursor binds with the substrate or a coating from prior ALD cycles on the substrate. In some embodiments, given the short time for the pulse/exposure for the ALD process the pulse lasts the entire exposure until the purge starts with the pulse time and exposure time being the same. The lithium precursor pulse time may be less than the first exposure time, or they may be equal such that the exposure is the same as the pulse. The first exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween). In some embodiments, the first predetermined time is in the range of 1-10 seconds. The first partial pressure of the lithium precursor can be in the range of 0.01-10 Torr (e.g., 0.01, 0.05, 0.1, 0.5, 1.0, 5.0, or 10 Torr, inclusive of all ranges and values therebetween). In some embodiments, the first partial pressure of the lithium precursor is in the range of 0.1-1 Torr. When it combine with other elements, such as F, S, or TMA, the short purge time many play the role in growth rate tuning.

The lithium precursor purge evacuates unreacted precursor from the reactor. The lithium precursor purge may be for a lithium precursor purge time of 0.5-30 seconds (e.g., 0.5, 1, 5, 10, 20, or 30 seconds, inclusive of all ranges and values therebetween), such as 15 seconds. The lithium precursor purge reduces the pressure in the reactor to within the range of 0.01-10 Torr (e.g., 0.01, 0.05, 0.1, 0.5, 1.0, 5.0, or 10 Torr, inclusive of all ranges and values therebetween), such as substantially to vacuum.

In some embodiments, exposing the substrate to first oxidant for a first oxidant exposure time and a second partial pressure of the first oxidant so that first oxidant reacts with the entity formed by the lithium precursor reacting with the substrate (or previous ALD deposited coatings). The first oxidant exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as about 1 second. The second partial pressure of the first oxidant can be in the range of 0.01-10 Torr (e.g., 0.01, 0.05, 0.1, 0.5, 1.0, 5.0, or 10 Torr, inclusive of all ranges and values therebetween). In some embodiments, the second partial pressure of the first oxidant is in the range of 0.1-1 Torr (e.g., about 0.5 Torr) such as 0.88 Torr.

The first oxidant purge evacuates unreacted precursor from the reactor. The first oxidant purge may be for a first oxidant purge time of 0.5-500 seconds (0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as 10 seconds. The first oxidant purge reduces the pressure in the reactor to within the range of 0.01-10 Torr (e.g., 0.01, 0.05, 0.1, 0.5, 1.0, 5.0, or 10 Torr, inclusive of all ranges and values therebetween), such as substantially to vacuum.

In some embodiments, the boron precursor is a vapor and the boron precursor pulse comprises input to the reactor of a boron precursor vapor for a boron precursor pulse time of a few milliseconds to tens of seconds (e.g., 0.5, 1, 5, 10, 20, or 30 seconds, inclusive of all ranges and values therebetween). The first partial pressure of the boron precursor pulse can be in the range of 0.01-1000 Torr (e.g., 10, 25, 50, 75, 100, 500, or 1000 Torr, inclusive of all ranges and values therebetween), such as, in one embodiment, at least 0.5-100 Torr. One of skill in the art will appreciate that the time length, pressure, and amount of precursor for the pulse are all factors in determining the overall amount for each of those operation parameters. For example, the pressure and amount may follow from the duration of the pulse but depend on the size of the chamber and the type of valve as would be understood from general knowledge regarding ALD. Note, for ease of reference herein, the process is described with regard to the pulse duration, but it should be understood that the precursor partial pressure is what dictates the diffusion boundary conditions. A carrier gas, such as argon or another non-reactive (with the substrate or the precursors) gas, may be used.

In some embodiments, the boron precursor exposure comprises exposing the substrate to the boron precursor for a first exposure time and a first partial pressure of the boron precursor so that the boron precursor binds with the substrate or a coating from prior ALD cycles on the substrate. In some embodiments, given the short time for the pulse/exposure for the ALD process the pulse lasts the entire exposure until the purge starts with the pulse time and exposure time being the same. The boron precursor pulse time may be less than the first exposure time, or they may be equal such that the exposure is the same as the pulse. The first exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween). In some embodiments, the first predetermined time is in the range of 1-10 seconds. The first partial pressure of the boron precursor can be in the range of 0.01-10 Torr (e.g., 0.01, 0.05, 0.1, 0.5, 1.0, 5.0, or 10 Torr, inclusive of all ranges and values therebetween). In some embodiments, the first partial pressure of the boron precursor is in the range of 0.1-1 Torr.

The boron precursor purge evacuates unreacted precursor from the reactor. The boron precursor purge may be for a boron precursor purge time of 0.5-30 seconds (e.g., 0.5, 1, 5, 10, 20, or 30 seconds, inclusive of all ranges and values therebetween), such as 15 seconds. The boron precursor purge reduces the pressure in the reactor to within the range of 0.01-10 Torr (e.g., 0.01, 0.05, 0.1, 0.5, 1.0, 5.0, or 10 Torr, inclusive of all ranges and values therebetween), such as substantially to vacuum.

The substrate, after reaction with the boron precursor, is then exposed to a second oxidant by a second oxidant pulse introducing the second oxidant to the reactor and then exposing for the second oxidant exposure such that the second oxidant reacts with the boron precursor or, more particularly, with intermediate entity formed by the boron precursor and the substrate (or ALD coating on the substrate).

In some embodiments, the second oxidant pulse comprises input to the reactor of the second oxidant vapor for a second oxidant pulse time of 0.5-30 seconds (e.g., 0.5, 1, 5, 10, 20, or 30 seconds, inclusive of all ranges and values therebetween), such as 1 second. The first partial pressure of the second oxidant pulse can be in the range of 0.01-10 Torr (e.g., 0.01, 0.05, 0.1, 0.5, 1.0, 5.0, or 10 Torr, inclusive of all ranges and values therebetween), such as 0.88 Torr.

In some embodiments, exposing the substrate to second oxidant for a second oxidant exposure time and a second partial pressure of the second oxidant so that second oxidant reacts with the entity formed by the boron precursor reacting with the substrate (or previous ALD deposited coatings). The second oxidant exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as about 1 second. The second partial pressure of the second oxidant can be in the range of 0.01-10 Torr (e.g., 0.01, 0.05, 0.1, 0.5, 1.0, 5.0, or 10 Torr, inclusive of all ranges and values therebetween). In some embodiments, the second partial pressure of the second oxidant is in the range of 0.1-1 Torr (e.g., about 0.5 Torr), such as 0.88 Torr.

The second oxidant purge evacuates unreacted precursor from the reactor. The second oxidant purge may be for a second oxidant purge time of 0.5-500 seconds (0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as 10 seconds. The second oxidant purge reduces the pressure in the reactor to within the range of 0.01-10 Torr (e.g., 0.01, 0.05, 0.1, 0.5, 1.0, 5.0, or 10 Torr, inclusive of all ranges and values therebetween), such as substantially to vacuum.

Any number of cycles of the first reaction depositing lithium and the second reaction depositing boron can be performed to reach a thickness of coating or to provide a desired alteration of the substrate properties. In some embodiments, the number of cycles of the ALD process can be in the range of 1-50 cycles (e.g., 1 cycle, 2, 3, 4, 5, 10, 15, 20, 25, 30, 35, 40, 45, or 50 cycles, inclusive of all ranges and values therebetween), such as in a super cycle of X supercycles of (Lithium Deposition Y cycles—Boron Deposition Z cycles). In some embodiments, dopants are deposited, such as Al, F, N, S, Ge, Zn, Mg, and/or Ti.

Results.

Thin films of LiBO were deposited at 200° C. in cross-flow ALD reactor on a variety of substrates, including n-type Si(100), and fused quartz. The Li terbutoxide reservoir was maintained at 150° C. using a temperature controller to provide a vapor pressure of ~20-50 mTorr, and yielded pressure pulses of ~0.05 Torr in the ALD system. Experiments used boric acid in methanol saturated solution as a precursor as well as the oxygen source for LiBO layer growth. The ALD precursor-purge timing sequences for LiBO are expressed as t1-t2-t3-t4, where t1 and t3 are the exposure times for the Li-tbox and the BAMeOH precursor, respectively, t2 and t4 are the corresponding $N_2$ purge periods, and all times are given in seconds. The ultra-high-purity $N_2$ carrier gas flow was set to 300 sccm, which gives a base pressure of 1.0 Torr in the ALD reaction chamber. The reactor pressure was measured by a heated MKS Baratron model 629B. Thickness and refractive index of LiBO layers were determined from samples prepared on Si(100) substrates using spectroscopic ellipsometry (J. A. Woollam Co. Alpha-SE). The composition of ALD LiBO films was evaluated XPS measurements were carried on a Thermo Fisher k-Alpha+. The XPS spectra were analyzed by using the Thermo Fisher Avantage software and were all the spectra was referenced to the of the surface adventitious carbon C is peak at 284.8 eV.

The ionic conductivity measured on the sample grown on interdigitate platinum electrode surface. Measurements carried out under inter (Ar) atmosphere. Ionic conductivity data was collected at different temperature on same device. In addition to film growth in-situ FTIR analysis was conducted to study half ALD cycle precursor—surface reactions.

Figure 2A:
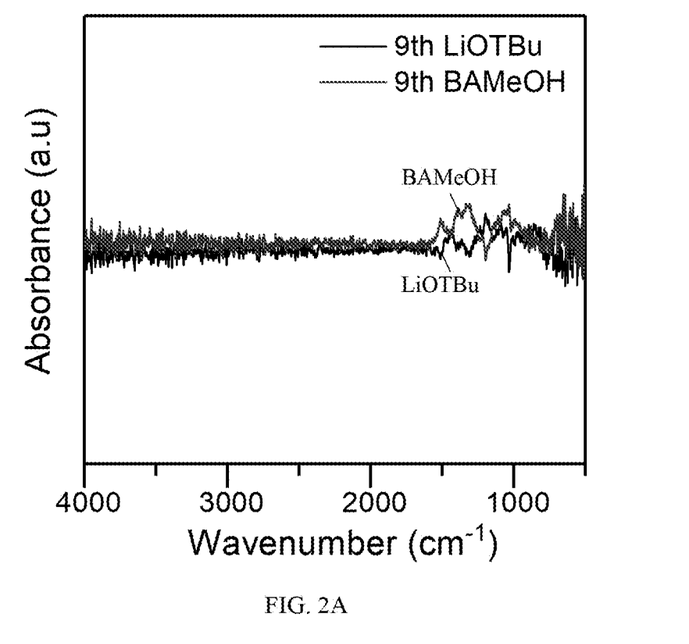
Figure 2B:
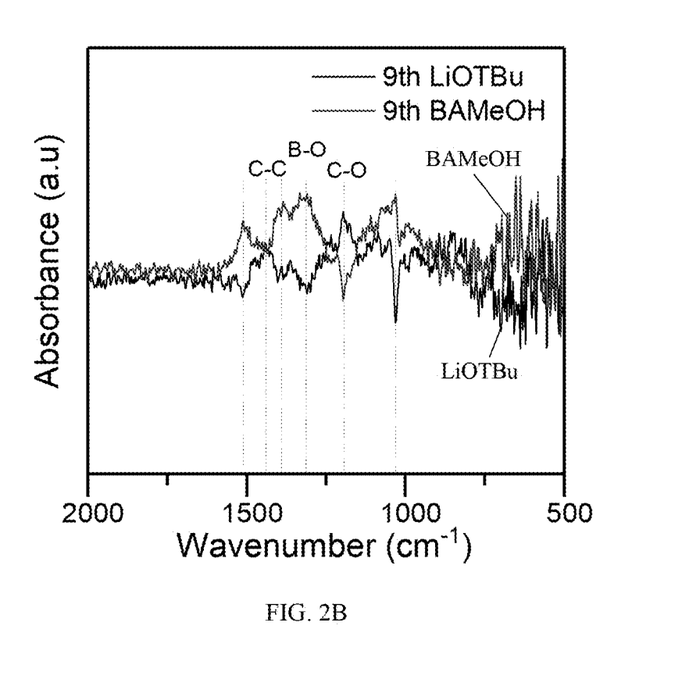
FIG. 2B is a close up of a section of FIG. 2A.
Figure 3:
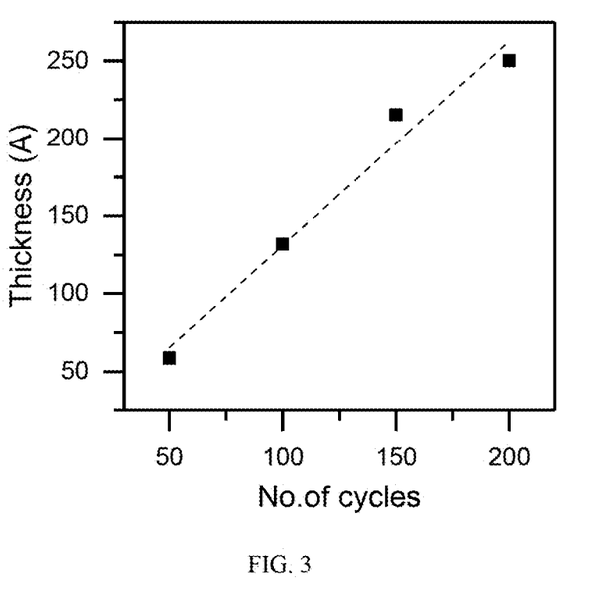
FIG. 3 illustrates a growth rate by ALD for lithium diborate using LiOTBu and BAMeOH. The growth rate observed is ~1.3 A/cycle.
Figure 4A:
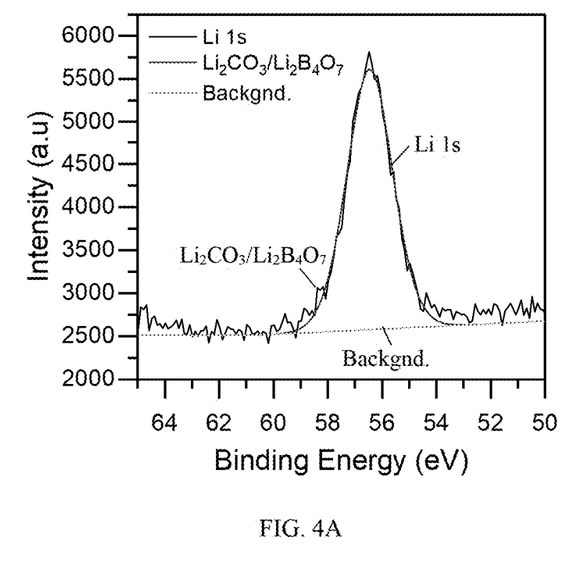
FIGS. 4A-4D are graphs of composition x-ray photoelectron spectroscopy ("XPS") results with the compositions, materials, and backgrounds indicated in the respective legends.
Figure 4B:
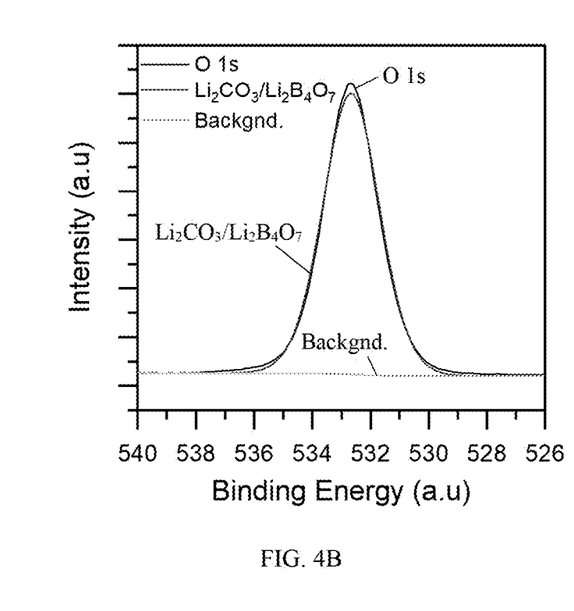
Figure 4C:
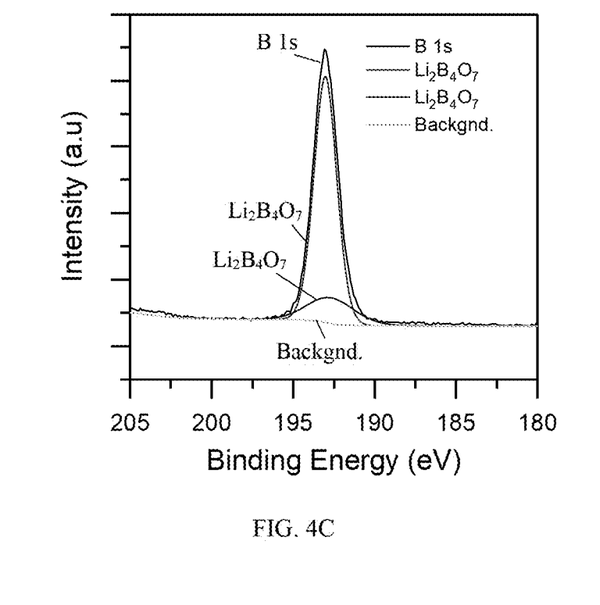
Figure 4D:
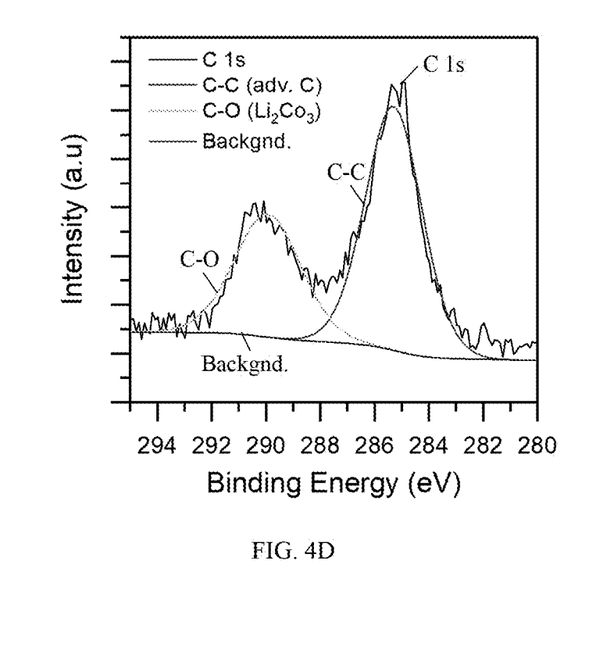
Figure 4E:
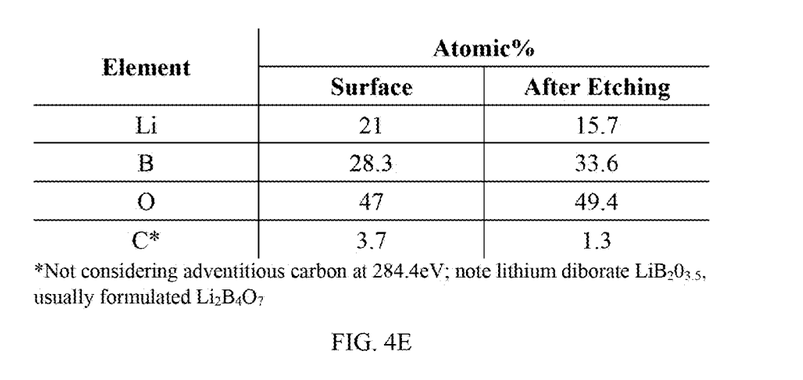
Figure 5:
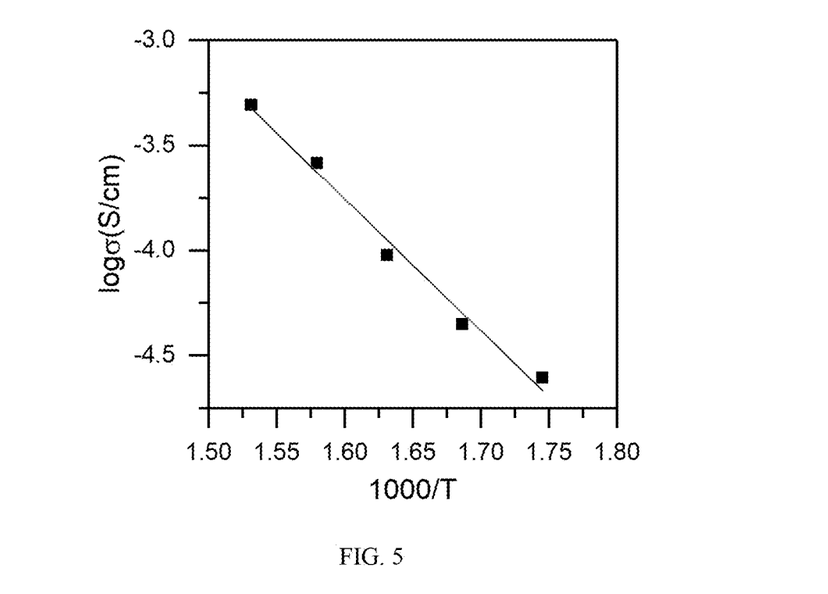
FIG. 5 is a graph of ionic conductivity of as-deposited film. The ionic conductivity was measured on the sample grown on interdigitate platinum electrode surface. Measurements were carried out under inter (Ar) atmosphere. The data points were collected at different temperature on same device.

FIGS. 2A-2B illustrate in-situ Fourier-transform infrared spectroscopy ("FTIR") results for lithium tertiary butoxide ("LiOTBu") and boric acid and methanol solution ("BAMeOH"). FIG. 2B is a close up of a section of FIG. 2A. FIG. 3 illustrates a growth rate by ALD for lithium diborate using LiOTBu and BAMeOH. The growth rate observed is ~1.3 A/cycle. FIGS. 4A-4D are graphs of composition x-ray photoelectron spectroscopy ("XPS") results with the compositions, materials, and backgrounds indicated in the respective legends. FIG. 4E illustrates the content (as atomic %) on the surface of the film and after Ar etching to remove the adventitious carbon on the surface. In typical XPS measurements, it is well know that the most of the nanomaterial (thin film) are contaminated with some atmospheric $CO_2$ or OH. To account for this, the surface is cleaned with sputter ions (Ar) which etch the surface with desire etch rate base on ion gun energy (1000 eV) and duration (30 s). After removal of contamination layer one can get reasonable clean surface composition. This composition is given in right column name as after etching. FIG. 5 is a graph of ionic conductivity of as-deposited film. The ionic conductivity was measured on the sample grown on interdigitate platinum electrode surface. Measurements were carried out under inter (Ar) atmosphere. The data points were collected at different temperature on same device.

Definitions

No claim element herein is to be construed under the provisions of 35 U.S.C. § 112(f), unless the element is expressly recited using the phrase "means for."

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. For example, circuit A communicably "coupled" to circuit B may signify that the circuit A communicates directly with circuit B (i.e., no intermediary) or communicates indirectly with circuit B (e.g., through one or more intermediaries).

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the figures. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above.

What is claimed is:

1. A method of forming a lithium boron coating comprising:
    providing a substrate within an atomic layer deposition reactor; and
    depositing a coating of lithium boron composite by an atomic layer deposition process including:
        pulsing a lithium precursor comprising a lithium tertiary butoxide into the reactor;
        purging the reactor of the lithium precursor;
        pulsing a solution of a first boron precursor and a first co-reactant comprising an organic solvent;
        purging the reactor of the first boron precursor and the first co-reactant; and
        pulsing a solution of a second boron precursor, different from the first boron precursor, and a second co-reactant different from the first co-reactant;
        wherein the second boron precursor comprises boron fluoride and the second co-reactant comprises at least one of HF or HF-pyridine, or the second boron precursor comprises boron sulfide and the second co-reactant comprises at least one of S or $H_2S$.

2. The method of claim 1, wherein the first boron precursor is boric acid.

3. The method of claim 1, wherein the first co-reactant is methanol.

4. The method of claim 1, wherein the first boron precursor is boric acid and the first co-reactant is methanol.

5. The method of claim 1, wherein the second boron precursor comprises the boron fluoride; the second co-reactant comprises at least one of HF or HF-pyridine; and the lithium boron coating comprises boron-doped lithium fluoride.

6. The method of claim 1, wherein the second boron precursor comprises the boron sulfides; the second co-reactant comprises at least one of S or $H_2S$; and the lithium boron coating comprises boron-doped lithium sulfide.

7. The method of claim 1, further comprising depositing via ALD a stabilizing layer.

8. The method of claim 1, wherein the first boron precursor is selected from the group consisting of boric acid, trimethyl borate, triethyl borate, $B_2H_6$, $B_2F_4$, $BF_3$ and $Hf(BH_4)_4$.

9. The method of claim 8, wherein the first co-reactant is selected from the group consisting of methanol, acetone, isopropyl alcohol (IPA), ethanol, and acetic acid.

10. A method of forming a boron lithium coating comprising:
    providing a substrate within an atomic layer deposition reactor; and
    depositing a coating of lithium boron composite by an atomic layer deposition process including:
        pulsing a lithium precursor comprising a lithium tertiary butoxide into the reactor;
        purging the reactor of the lithium precursor;
        pulsing a first boron precursor and the first co-reactant; and
        purging the reactor of the boron first precursor and the first co-reactant; and
        pulsing a second boron precursor, different from the first boron precursor, and a second-co-reactant different from the first co-reactant;
        wherein the second boron precursor comprises boron fluoride and the second co-reactant comprises at least one of HF or HF-pyridine, or the second boron precursor comprises boron sulfide and the second co-reactant comprises at least one of S or $H_2S$.

11. The method of claim 10, wherein the first boron precursor is trimethyl borate.

12. The method of claim 10, wherein the first boron precursor is boric acid.

13. The method of claim 10, wherein pulsing the second boron precursor and the second co-reactant comprises pulsing boron fluoride and at least one of HF or HF-pyridine, and the boron lithium coating comprises boron-doped lithium fluoride.

14. The method of claim 10, wherein pulsing the second boron precursor and the second co-reactant comprises pulsing boron sulfide and at least one of S or $H_2S$, and the boron lithium coating comprises boron-doped lithium sulfide.

* * * * *